United States Patent
Lin et al.

(10) Patent No.: US 9,660,073 B1
(45) Date of Patent: May 23, 2017

(54) HIGH-VOLTAGE SEMICONDUCTOR DEVICE AND METHOD FOR MANUFACTURING THE SAME

(71) Applicant: Vanguard International Semiconductor Corporation, Hsinchu (TW)

(72) Inventors: Chih-Wei Lin, Jhubei (TW); Pi-Kuang Chuang, Taichung (TW); Chao-Wei Wu, Changhua (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/972,947

(22) Filed: Dec. 17, 2015

(51) Int. Cl.
| | |
|---|---|
| *H01L 29/78* | (2006.01) |
| *H01L 29/10* | (2006.01) |
| *H01L 29/06* | (2006.01) |
| *H01L 29/66* | (2006.01) |
| *H01L 21/266* | (2006.01) |
| *H01L 21/8234* | (2006.01) |
| *H01L 27/088* | (2006.01) |

(52) U.S. Cl.
CPC ........ *H01L 29/7816* (2013.01); *H01L 21/266* (2013.01); *H01L 21/823418* (2013.01); *H01L 27/088* (2013.01); *H01L 29/0649* (2013.01); *H01L 29/1095* (2013.01); *H01L 29/66681* (2013.01)

(58) Field of Classification Search
CPC .................................................. H01L 29/7816
See application file for complete search history.

(56) References Cited

U.S. PATENT DOCUMENTS

| | | | | |
|---|---|---|---|---|
| 7,821,082 B1* | 10/2010 | Lin | ...................... | H01L 29/7835 257/409 |
| 8,378,420 B2* | 2/2013 | Mallikarjunaswamy | ................... | H01L 21/82380 257/331 |
| 8,803,234 B1* | 8/2014 | Liao | ...................... | H01L 29/402 257/335 |
| 9,059,281 B2* | 6/2015 | Brochu, Jr. | ......... | H01L 29/7833 |
| 9,190,408 B2* | 11/2015 | Mallikarjunaswamy | ................... | H01L 21/82380 |

(Continued)

FOREIGN PATENT DOCUMENTS

TW   201320335 A1   5/2013

*Primary Examiner* — Scott B Geyer
*Assistant Examiner* — S. M. S Imitaz
(74) *Attorney, Agent, or Firm* — Birch, Stewart, Kolasch & Birch, LLP (57) ABSTRACT

A high-voltage semiconductor device is provided. The device includes a semiconductor substrate including a well region of a first conductivity type and an isolation structure in the well region. First and second regions are respectively defined on both sides of the isolation structure. First and second gate structures are respectively disposed on the first and second regions. First and second implant regions of a second conductivity type that is different from the first conductivity type are respectively in the first and second regions and adjacent to the isolation structure. A counter implant region is in the well region under the isolation structure and laterally extends under the first and second implant regions. The counter implant region has the first conductivity type and has a doping concentration that is greater than that of the well region. A method for fabricating the high-voltage semiconductor device is also disclosed.

19 Claims, 5 Drawing Sheets

(56) References Cited

U.S. PATENT DOCUMENTS

| | | | |
|---|---|---|---|
| 2005/0042815 A1* | 2/2005 | Williams | H01L 21/26513 438/202 |
| 2006/0220120 A1* | 10/2006 | Horch | H01L 29/0634 257/341 |
| 2006/0278924 A1* | 12/2006 | Kao | H01L 29/0653 257/339 |
| 2008/0073745 A1* | 3/2008 | Tang | H01L 21/84 257/500 |
| 2009/0236665 A1* | 9/2009 | Lin | H01L 29/7836 257/368 |
| 2010/0181639 A1* | 7/2010 | Huang | H01L 21/763 257/506 |
| 2010/0237439 A1* | 9/2010 | Lee | H01L 29/42372 257/408 |
| 2011/0127602 A1* | 6/2011 | Mallikarjunaswamy | H01L 21/82380 257/331 |
| 2014/0001545 A1* | 1/2014 | Yang | H01L 29/66689 257/337 |
| 2014/0001547 A1* | 1/2014 | Schulze | H01L 29/7811 257/337 |
| 2014/0021539 A1* | 1/2014 | Hsiao | H01L 29/66492 257/335 |
| 2015/0325694 A1* | 11/2015 | Chan | H01L 29/66681 327/434 |

\* cited by examiner

HIGH-VOLTAGE SEMICONDUCTOR DEVICE AND METHOD FOR MANUFACTURING THE SAME

BACKGROUND

Field of the Disclosure

The present disclosure relates to a semiconductor technology, and in particular, it relates to a high-voltage semiconductor device having excellent isolation capability.

Description of the Related Art

High-voltage semiconductor technology is applied to integrated circuits (ICs) with high voltages and high power. Traditional high-voltage semiconductor devices, such as double diffused drain MOSFET (DDDMOSFETs) and lateral diffused MOSFET (LDMOSFET) are mainly used for devices with at least 18 volts or higher. The advantages of high-voltage device technology include cost effectiveness and process compatibility, and thus high-voltage device technology has been widely used in display driver IC devices, and power supply devices, and power management, communications, autotronics, and industrial control fields, etc.

Because of the properties of compactness and high output current of the DDDMOSFET, it has been widely used in source driver IC devices with an operating voltage of less than about 30 volts. A double diffused drain (DDD) is formed of two implantation regions that serve as a source or drain in a high-voltage MOSFET device. Herein, the term "high-voltage MOSFET device" refers to a transistor device having a high breakdown voltage.

Adjacent DDDMOSFETs are typically isolated from each other by the use of a filed oxide, such as a trench isolation structure. The trench isolation structure, a metallization layer (e.g., including an inter-layer dielectric (ILD) layer and an interconnect wiring layer) over the trench isolation structure, and a well region under the trench isolation structure form a parasitic MOS transistor. As a result, when the DDDMOSFET is operated, the parasitic MOS transistor would be easily turned on by the voltage applied to the interconnect wiring layer, so that the function of isolation that is provided by the trench isolation structure fails, thereby resulting in a circuit failure. Therefore, the width and/or the depth of the trench isolation structure must be increased to prevent the parasitic MOS transistor from being turned on while the DDDMOSFET is operating.

However, device size increases with increased width and/or depth of the trench isolation structure, thereby resulting in increased chip area. Additionally, processing difficulties and manufacturing costs also increase with the increased depth of the trench isolation structure. Therefore, there is a need to develop a high-voltage semiconductor device and a method for manufacturing the same that are capable of addressing the problems described above.

SUMMARY

In some embodiments of the disclosure, a high-voltage semiconductor device is provided. The high-voltage semiconductor device includes a semiconductor substrate including a well region of a first conductivity type and an isolation structure in the well region. A first region and a second region are respectively defined on both sides of the isolation structure. A first gate structure and a second gate structure are respectively disposed on the first region and the second region. A first implant region and a second implant region are respectively in the first region and the second region and adjacent to the isolation structure. The first implant region and the second implant region have a second conductivity type that is different from the first conductivity type. A counter implant region is in the well region under the isolation structure and laterally extends under the first implant region and the second implant region. The counter implant region has the first conductivity type and has a greater doping concentration than the doping concentration of the well region.

In some embodiments of the disclosure, a method for fabricating a high-voltage semiconductor device is provided. The method includes providing a semiconductor substrate including a well region of a first conductivity type and an isolation structure in the well region. A first region and a second region are respectively defined on both sides of the isolation structure. The method further includes forming a counter implant region of the first conductivity type in the well region under the isolation structure. The counter implant region laterally extends under the first implant region and the second implant region, and has a doping concentration greater than a doping concentration of the well region. The method further includes forming a first implant region and a second implant region respectively on the counter implant region in the first region and the second region and adjacent to the isolation structure. The first implant region and the second implant region have a second conductivity type that is different from the first conductivity type. The method further includes forming a first gate structure and a second gate structure respectively on the first region and the second region.

BRIEF DESCRIPTION OF THE DRAWINGS

The present disclosure can be further understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

An exemplary embodiment of the present disclosure provides a high-voltage semiconductor device, such as an LDMOSFET, which utilizes a counter implant to enhance the isolation capability between the adjacent high-voltage semiconductor devices, thereby narrowing the distance between the high-voltage semiconductor devices to reduce the size of the device or the chip area.

Figure 1A:
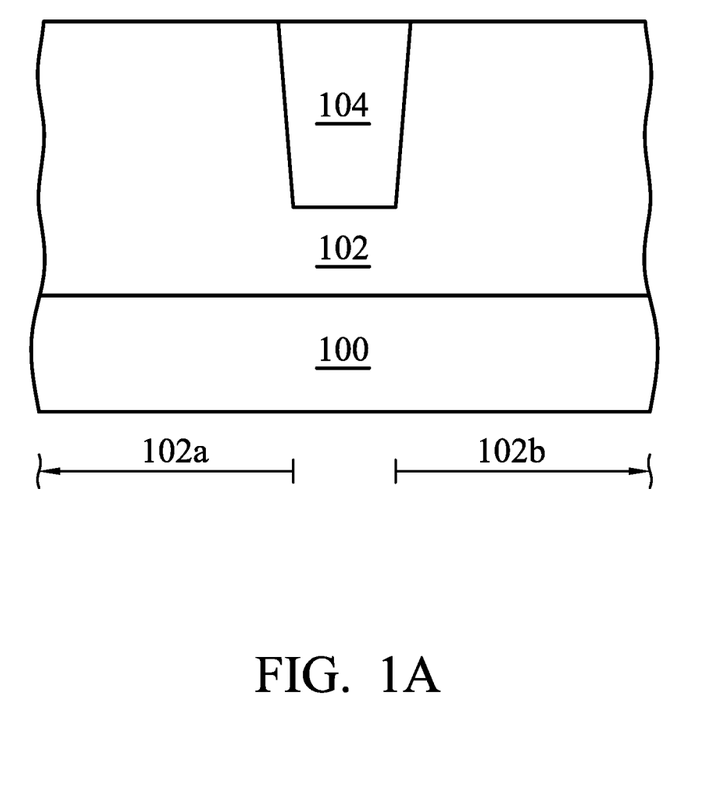
FIGS. 1A to 1E are cross sections of a method for fabricating a high-voltage semiconductor device according to an embodiment of the present disclosure.
Figure 1B:
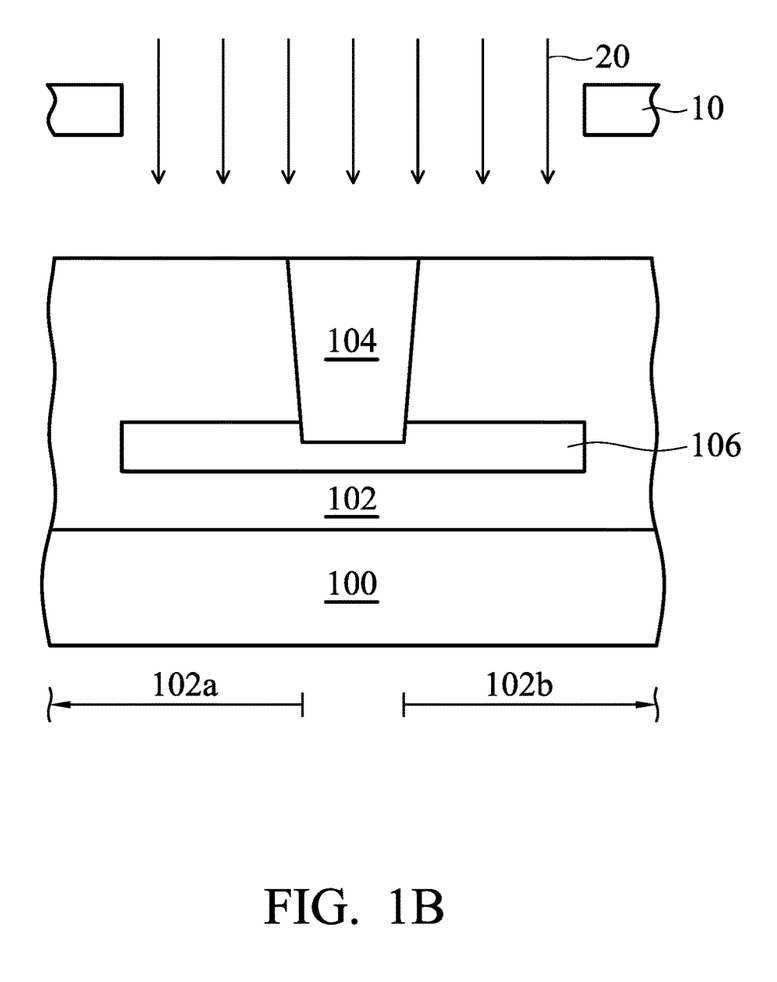
Figure 1C:
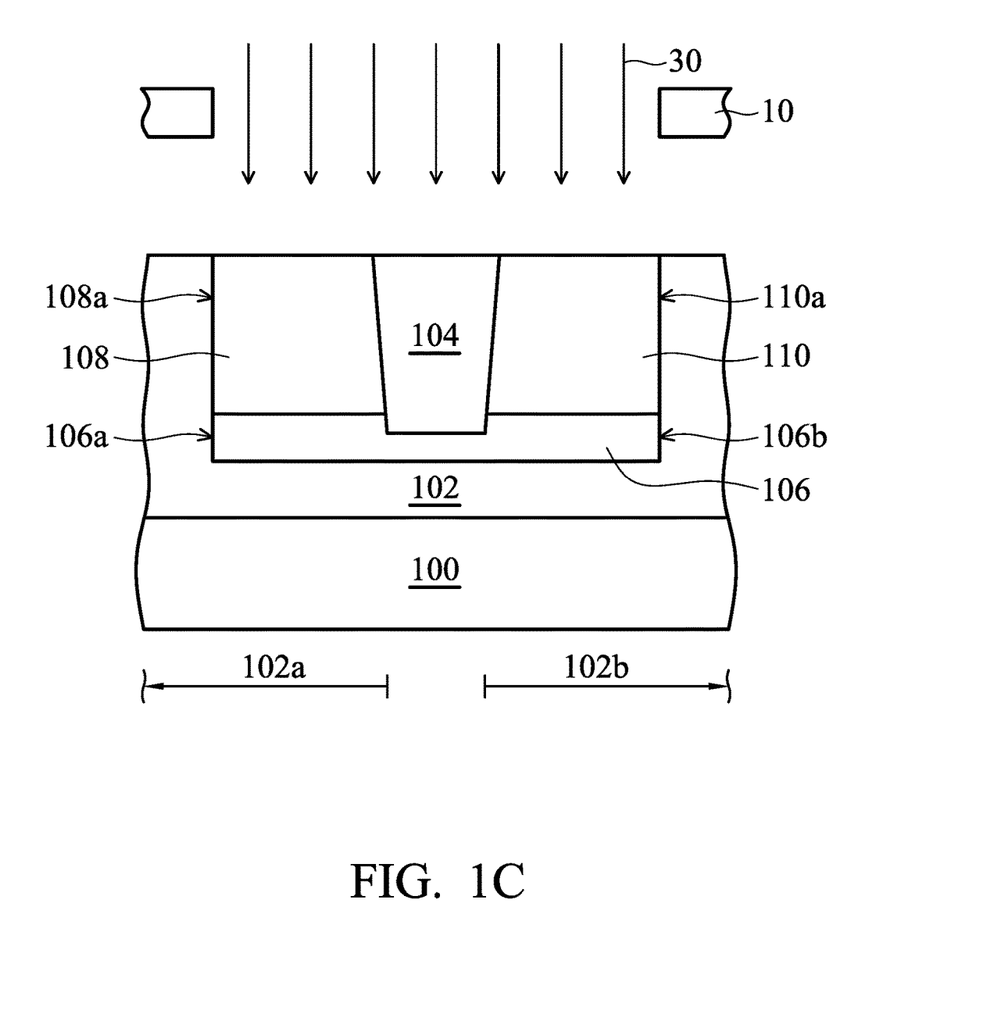
Figure 1D:
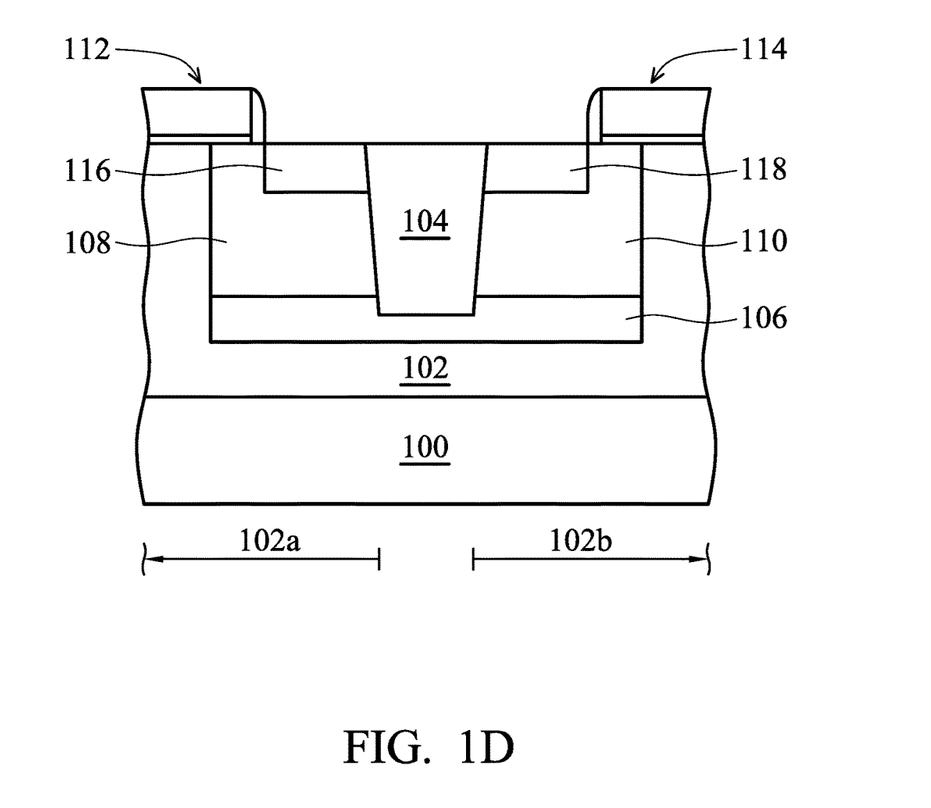
Figure 1E:
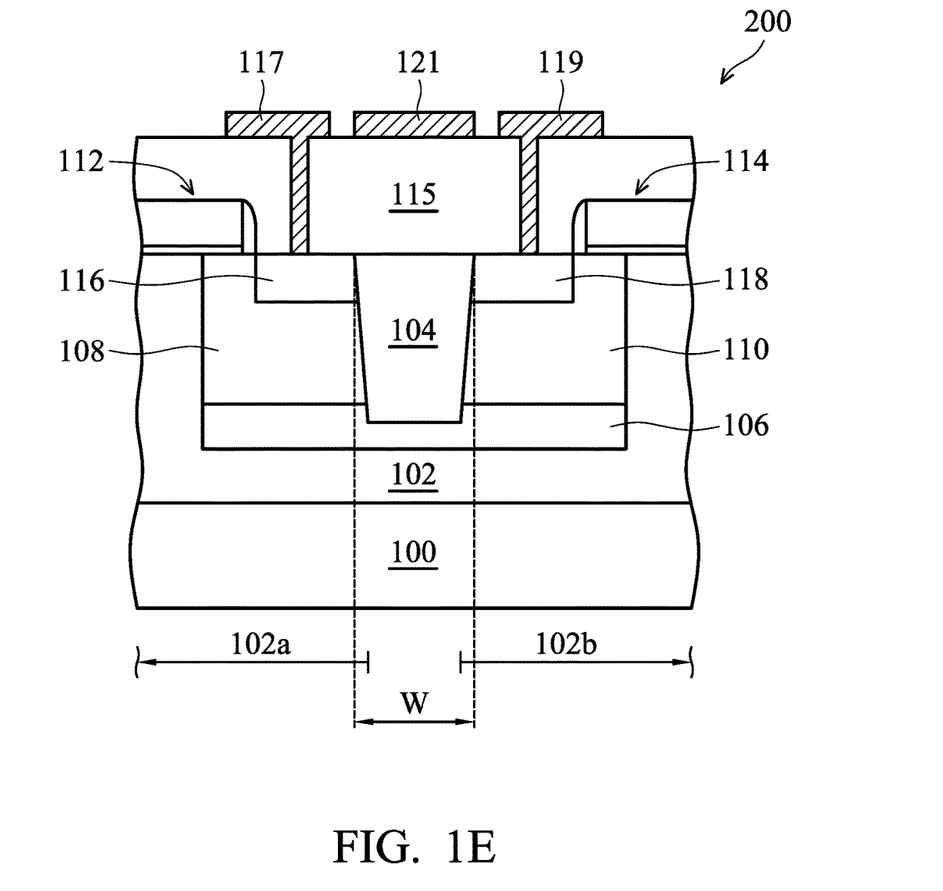

Refer to FIG. 1E, which illustrates a cross section of an exemplary embodiment of a high-voltage semiconductor device 200 according to the present disclosure. In the embodiment, the high-voltage semiconductor device 200 includes a semiconductor substrate 100 including a well region 102 and at least an isolation structure 104. A first region 102a and a second region 102b are defined in the well region 102 on both sides of the isolation structure 104. In the embodiment, the well region 102 serves as a high-voltage well region in the high-voltage semiconductor device 200 and has a first conductivity type, such as a P-type or N-type. In one example, the well region 102 is P-type and has a doping concentration of about $1.0 \times 10^{16}$ ions/cm$^3$. In another example, the well region 102 is N-type and has a doping concentration of about $9.0 \times 10^{15}$ ions/cm$^3$.

In one embodiment, the isolation structure 104 includes a field oxide, such as a trench isolation structure. In one example, the trench isolation structure has a depth greater than about 4000 Å but does not exceed 8000 Å. Namely, the depth of the trench isolation structure is greater than that of a traditional shallow trench isolation (STI) structure, but is less than that of a traditional deep trench isolation structure. In some embodiments, the isolation structure 104 includes a local oxidation of silicon, LOCOS.

In the embodiment, the high-voltage semiconductor device 200 further includes a first gate structure 112 and a second gate structure 114. The first gate structure 112 is disposed on the semiconductor substrate 100 corresponding to the first region 102a, and the second gate structure 114 is disposed on the semiconductor substrate 100 corresponding to the second region 102b. Each gate structure includes a gate dielectric layer in direct contact with the well region 102 of the semiconductor substrate 100, a gate electrode on the gate dielectric layer, and gate spacers on sidewalls of the gate electrode.

In the embodiment, the high-voltage semiconductor device 200 further includes a first implant region 108 and a second implant region 110. The first implant region 108 and the second implant region 110 serve as double diffused drain regions in the high-voltage semiconductor device 200. In the embodiment, the first implant region 108 is formed in the first region 102a, extends under the first gate electrode 112 and is adjacent to the isolation structure 104. Moreover, the second implant region 110 is formed in the second region 102b, extends under the second gate electrode 114 and is adjacent to the isolation structure 104. In the embodiment, the depths of the first implant region 108 and the second implant region 110 are less than that of the isolation structure 104. Moreover, the first implant region 108 and the second implant region 110 have a second conductivity type that is different from the first conductivity type. For example, the first conductivity type may be P-type, and the second conductivity type may be N-type. In another example, the first conductivity type may be N-type, and the second conductivity type may be P-type.

In the embodiment, the high-voltage semiconductor device 200 further includes a third implant region 116 and a fourth implant region 118 having the second conductivity type. The third implant region 116 is formed in the first implant region 108, and the fourth implant region 118 is formed in the second implant region 110. The third implant region 116 and the fourth implant region 118 serve as source/drain implant regions and have a doping concentration greater than that of the first implant region 108 and the second implant region 110 that serve as double diffused drain regions.

In the embodiment, the high-voltage semiconductor device 200 further includes a counter implant region 106 that is formed in the well region 102 under the isolation structure 104 and laterally extends under the first implant region 108 and the second implant region 110. In one embodiment, the counter implant region 106 has two edges 106a and 106b (as shown in FIG. 1C) opposite each other. The edges 106a and 106b respectively and substantially align to an edge 108a (as shown in FIG. 1C) of the first implant region 108 and an edge 110a (as shown in FIG. 1C) of the second implant region 110. In the embodiment, the counter implant region 106 has the first conductivity type and has a doping concentration greater than that of the well region 102. In an example, the counter implant region 106 is P-type and has a doping concentration of about $5.0 \times 10^{16}$ ions/cm$^3$. In another example, the counter implant region 106 is N-type and has a doping concentration of about $6.0 \times 10^{16}$ ions/cm$^3$.

In the embodiment, the high-voltage semiconductor device 200 further includes a metallization layer disposed on the semiconductor substrate 100 and covers the first gate structure 112 and the second gate structure 114. The metallization layer may include an interlayer dielectric (ILD) layer 115 and an interconnect structure. The interconnect structure includes at least source/drain electrodes 117 and 119 that are respectively coupled to third implant region 116 and the fourth implant region 118, and an interconnect wiring layer 121 on the ILD layer 115 above the isolation structure 104.

Next, refer to FIGS. 1A to 1E, which are cross sections of a method for fabricating a high-voltage semiconductor device 200 according to an embodiment of the present disclosure. In FIG. 1A, a semiconductor substrate 100 is provided. The semiconductor substrate 100 includes a well region 102 and at least an isolation structure 104. A first region 102a and a second region 102b are defined in the well region 102 on both sides of the isolation structure 104. In the embodiment, the semiconductor substrate 100 may be a silicon substrate, a SiGe substrate, a bulk semiconductor substrate, a compound semiconductor substrate, a silicon-on-insulator (SOI) substrate or another well-known semiconductor substrate.

The well region 102 serves as a high-voltage well region in the high-voltage semiconductor device 200 and has a first conductivity type, such as a P-type or N-type. In one example, the well region 102 is P-type and has a doping concentration of about $1.0 \times 10^{16}$ ions/cm$^3$. In another example, the well region 102 is N-type and has a doping concentration of about $9.0 \times 10^{15}$ ions/cm$^3$.

The isolation structure 104 includes a field oxide, such as a trench isolation structure. In one example, the trench isolation structure has a depth greater than about 4000 Å but does not exceed 8000 Å.

Refer to FIG. 1B; a first ion implantation 20 is performed using an implant mask 10, to form a counter implant region 106 having the first conductivity type in the well region 102 under the adjacent isolation structure 104. The counter implant region 106 has a doping concentration greater than that of the well region 102. In an example, the counter implant region 106 is P-type and has a doping concentration of about $5.0 \times 10^{16}$ ions/cm$^3$. In another example, the counter implant region 106 is N-type and has a doping concentration of about $6.0 \times 10^{16}$ ions/cm$^3$. In the embodiment, since the implant mask 10 has an opening to expose the isolation structure 104 and portions of the first and second regions 102a and 102b adjacent to the isolation structure 104, the formed counter implant region 106 laterally extends into the first and second regions 102a and 102b.

Refer to FIG. 1C; a second ion implantation 30 is performed using the same implant mask 10, to form a first implant region 108 and the second implant region 110 respectively in the first region 102a and the second region 102b and adjacent to the isolation structure 104. In the embodiment, the first implant region 108 and the second implant region 110 have a depth less than that of the isolation structure 104, and respectively extend to above the counter implant region 106 corresponding to the first region 102a and the second region 102b. Moreover, the first implant region 108 and the second implant region 110 have a second conductivity type that is different from the first conductivity type. In an example, the first conductivity type is P-type, and the second conductivity type is N-type. In another example, the first conductivity type is N-type, and the second conductivity type is P-type. In the embodiment, since the first and second implant regions 108 and 110 and the counter implant region 106 are formed by the use of the same implant mask, two opposite edges 106a and 106b of the counter implant region 106 respectively substantially align to an edge 108a of the first implant region 108 and an edge 110a of the second implant region 110.

Refer to FIG. 1D; a first gate structure 112 and a second gate structure 114 are respectively formed on the first region 102a and a second region 102b by a conventional MOS process. Moreover, a third implant region 116 and a fourth implant region 118 having the second conductivity type are respectively formed in the first implant region 108 and the second implant region 110. The third implant region 116 and the fourth implant region 118 serve as source/drain implant regions and have a greater doping concentration than that of the first implant region 108 and the second implant region 110 that serve as double diffused drain regions.

Refer to FIG. 1E; a metallization layer is formed over the semiconductor substrate 100 by conventional metallization process, to cover the first gate structure 112 and the second gate structure 114. As a result, a high-voltage semiconductor device 200 is completed. In one embodiment, the metallization layer may include an ILD layer 115 and an interconnect structure. In one embodiment, the interconnect structure includes at least source/drain electrodes 117 and 119 that are respectively coupled to third implant region 116 and the fourth implant region 118, and an interconnect wiring layer 121 on the ILD layer 115 above the isolation structure 104.

In the high-voltage semiconductor device 200, the interconnect wiring layer 121, the ILD layer 115, the isolation structure 104, and the well region 102 form a parasitic MOS transistor. When the high-voltage semiconductor device 200 is operated, the counter implant region 106 can prevent the parasitic MOS transistor from being turned on by the voltage applied on the interconnect wiring layer 121, thereby assisting the isolation structure 104 to maintain its isolation function. Moreover, since there is the counter implant region 106 under the first and second implant regions 108 and 110, the reduced surface electric field (RESURF) effect can be mitigated.

Refer to table 1, which shows the relationship between the drain current (A) of a parasitic MOS transistor at a working voltage of 40 volts (V) and the surface width ($\mu m$) of the isolation structure that is in an N-type high-voltage MOS transistor without a counter implant region and in an N-type high-voltage MOS transistor with a counter implant region (as shown in FIG. 1E).

TABLE 1

| Surface width of isolation structure ($\mu m$) | N-type high-voltage MOS transistor without counter implant region Drain current of parasitic MOS transistor (A) | N-type high-voltage MOS transistor with counter implant region Drain current of parasitic MOS transistor (A) |
| --- | --- | --- |
| 2.0 | $4.2 \times 10^{-6}$ | $2.7 \times 10^{-12}$ |
| 1.8 | $3.0 \times 10^{-5}$ | $2.7 \times 10^{-12}$ |
| 1.6 | $1.7 \times 10^{-4}$ | $2.7 \times 10^{-12}$ |
| 1.4 | $6.5 \times 10^{-4}$ | $2.7 \times 10^{-12}$ |
| 1.2 | $2.2 \times 10^{-3}$ | $2.7 \times 10^{-12}$ |
| 1.0 | — | $2.8 \times 10^{-12}$ |

As shown in table 1, when the surface width ($\mu m$) of the isolation structure is decreased from 2.0 $\mu m$ to 1.2 $\mu m$, the drain current (A) of the parasitic MOS transistor in the N-type high-voltage MOS transistor without the counter implant region is rapidly increased from $4.2 \times 10^{-6}$ A to $2.2 \times 10^{-3}$ A. However, when the surface width ($\mu m$) of the isolation structure is decreased from 2.0 $\mu m$ to 1.2 $\mu m$, the drain current (A) of the parasitic MOS transistor in the N-type high-voltage MOS transistor with the counter implant region is maintained within a range of about $2.7 \times 10^{-12}$ A to $2.8 \times 10^{-12}$ A that is much less than $4.2 \times 10^{-6}$ A. Namely, the counter implant region in the N-type high-voltage MOS transistor can still effectively prevent the parasitic MOS transistor from being turned on even if the surface width ($\mu m$) of the isolation structure is decreased from 2.0 $\mu m$ to 1.2 $\mu m$.

Refer to table 2, which shows the relationship between the drain current (A) of a parasitic MOS transistor at a working voltage of −40 volt (V) and the surface width ($\mu m$) of the isolation structure that is in a P-type high-voltage MOS transistor without a counter implant region and in a P-type high-voltage MOS transistor with a counter implant region (as shown in FIG. 1E).

TABLE 2

| Surface width of isolation structure ($\mu m$) | P-type high-voltage MOS transistor without counter implant region Drain current of parasitic MOS transistor (A) | P-type high-voltage MOS transistor with counter implant region Drain current of parasitic MOS transistor (A) |
| --- | --- | --- |
| 2.0 | $-3.7 \times 10^{-8}$ | $-7.4 \times 10^{-13}$ |
| 1.8 | $-6.4 \times 10^{-7}$ | $-7.4 \times 10^{-13}$ |
| 1.6 | $-1.0 \times 10^{-5}$ | $-7.4 \times 10^{-13}$ |
| 1.4 | $-5.7 \times 10^{-5}$ | $-7.4 \times 10^{-13}$ |
| 1.2 | $-1.7 \times 10^{-4}$ | $-7.4 \times 10^{-13}$ |
| 1.0 | $-4.1 \times 10^{-4}$ | $-1.3 \times 10^{-12}$ |

As shown in table 2, when the surface width ($\mu m$) of the isolation structure is decreased from 2.0 $\mu m$ to 1.2 $\mu m$, the drain current (A) of the parasitic MOS transistor in the P-type high-voltage MOS transistor without the counter implant region is rapidly increased from $-3.7 \times 10^{-8}$ A to $-4.1 \times 10^{-4}$ A. However, when the surface width ($\mu m$) of the isolation structure is decreased from 2.0 $\mu m$ to 1.2 $\mu m$, the drain current (A) of the parasitic MOS transistor in the P-type high-voltage MOS transistor with the counter implant region is maintained within a range of about $-7.4 \times 10^{-13}$ A to $-1.3 \times 10^{-12}$ A that is much less than $-3.7 \times 10^{-8}$ A. Namely, the counter implant region in the P-type high-voltage MOS transistor can still effectively prevent the parasitic MOS transistor from being turned on even if the surface width ($\mu m$) of the isolation structure is decreased from 2.0 $\mu m$ to 1.2 $\mu m$.

According to the foregoing embodiments, since the high-voltage semiconductor device 200 includes a counter implant region 106, the surface width W of the isolation structure 104 may be reduced at least more than 50%, as compared to the P-type or N-type high-voltage semiconductor device without the counter implant region. As a result, the chip area can be effectively reduced by reducing the plan size of the isolation structure 104, thereby increasing the number of chips in each wafer. Moreover, compared to the high-voltage semiconductor device using a deep trench isolation structure, the depth of the trench isolation structure 104 in the high-voltage semiconductor device 200 with the counter implant region 106 is greater than 4000 Å but does not exceed 8000 Å, and therefore the difficulty of processing and the manufacturing cost can be reduced. Additionally, since the counter implant region 106, the first implant region 108, and the second implant region 110 are formed by the use of the same implant mask, there is no need to use any additional implant mask.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage semiconductor device, comprising:
a semiconductor substrate comprising a well region of a first conductivity type and an isolation structure in the well region, wherein a first region and a second region are respectively defined on both sides of the isolation structure;
a first gate structure and a second gate structure respectively disposed on the first region and the second region;
a first implant region and a second implant region respectively in the first region and the second region and adjacent to the isolation structure, wherein the first implant region and the second implant region have a second conductivity type that is different from the first conductivity type; and
a counter implant region in the well region under the isolation structure and laterally extending under the first implant region and the second implant region, wherein the counter implant region has the first conductivity type and has a doping concentration greater than a doping concentration of the well region.

2. The device as claimed in claim 1, wherein the counter implant region has two edges opposite each other, and the two edges respectively and substantially align to an edge of the first implant region and an edge of the second implant region.

3. The device as claimed in claim 1, wherein the first conductivity type is P-type and the second conductivity type is N-type.

4. The device as claimed in claim 3, wherein the doping concentration of the well region is about $1.0\times10^{16}$ ions/cm$^3$ and the doping concentration of the counter implant region is about $5.0\times10^{16}$ ions/cm$^3$.

5. The device as claimed in claim 1, wherein the first conductivity type is N-type and the second conductivity type is P-type.

6. The device as claimed in claim 5, wherein the doping concentration of the well region is about $9.0\times10^{15}$ ions/cm$^3$ and the doping concentration of the counter implant region is about $6.0\times10^{16}$ ions/cm$^3$.

7. The device as claimed in claim 1, wherein the isolation structure is a trench isolation structure and a depth of the trench isolation structure is greater than 4000 Å but does not exceed 8000 Å.

8. The device as claimed in claim 1, further comprising a third implant region and a fourth implant region of the second conductivity type, respectively in the first implant region and the second implant region.

9. The method as claimed in claim 8, wherein the third implant region and the fourth implant region have a doping concentration greater than a doping concentration of the first implant region and the second implant region.

10. A method for fabricating a high-voltage semiconductor device, comprising:
providing a semiconductor substrate comprising a well region of a first conductivity type and an isolation structure in the well region, wherein a first region and a second region are respectively defined on both sides of the isolation structure;
forming a counter implant region of the first conductivity type in the well region under the isolation structure, wherein the counter implant region laterally extends under the first region and the second region, and has a doping concentration greater than a doping concentration of the well region;
forming a first implant region and a second implant region respectively on the counter implant region in the first region and the second region and adjacent to the isolation structure, wherein the first implant region and the second implant region have a second conductivity type that is different from the first conductivity type; and
forming a first gate structure and a second gate structure respectively on the first region and the second region.

11. The method as claimed in claim 10, wherein the counter implant region is formed by the use of an implant mask, and the first implant region and the second implant region are simultaneously formed by the use of the implant mask.

12. The method as claimed in claim 10, wherein the counter implant region has two edges opposite each other, and the two edges respectively and substantially align to an edge of the first implant region and an edge of the second implant region.

13. The method as claimed in claim 10, wherein the first conductivity type is P-type and the second conductivity type is N-type.

14. The method as claimed in claim 13, wherein the doping concentration of the well region is about $1.0\times10^{16}$ ions/cm$^3$ and the doping concentration of the counter implant region is about $5.0\times10^{16}$ ions/cm$^3$.

15. The method as claimed in claim 10, wherein the first conductivity type is N-type and the second conductivity type is P-type.

16. The method as claimed in claim 15, wherein the doping concentration of the well region is about $9.0\times10^{15}$ ions/cm$^3$ and the doping concentration of the counter implant region is about $6.0\times10^{16}$ ions/cm$^3$.

17. The method as claimed in claim 10, wherein the isolation structure is a trench isolation structure and a depth of the trench isolation structure is greater than 4000 Å but does not exceed 8000 Å.

18. The method as claimed in claim 10, further comprising forming a third implant region and a fourth implant region of the second conductivity type respectively in the first implant region and the second implant region.

19. The method as claimed in claim 18, wherein the third implant region and the fourth implant region have a doping concentration greater than a doping concentration of the first implant region and the second implant region.

\* \* \* \* \*